(12) United States Patent
Hikosaka et al.

(10) Patent No.: US 7,982,466 B2
(45) Date of Patent: Jul. 19, 2011

(54) INSPECTION METHOD FOR SEMICONDUCTOR MEMORY

(75) Inventors: Yukinobu Hikosaka, Kawasaki (JP); Tomohiro Takamatsu, Kawasaki (JP); Yoshinori Obata, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/593,018

(22) Filed: Nov. 6, 2006

(65) Prior Publication Data

US 2007/0058416 A1    Mar. 15, 2007

Related U.S. Application Data

(63) Continuation of application No. PCT/JP2004/007962, filed on Jun. 8, 2004.

(51) Int. Cl.
*G01R 31/08* (2006.01)
(52) U.S. Cl. .......................... 324/523; 324/211; 324/527
(58) Field of Classification Search .................. 324/523, 324/524, 210, 228, 224, 262
See application file for complete search history.

(56) References Cited

U.S. PATENT DOCUMENTS

| | | | |
|---|---|---|---|
| 5,086,412 A * | 2/1992 | Jaffe et al. ..................... | 365/145 |
| 5,337,279 A * | 8/1994 | Gregory et al. ................ | 365/201 |
| 5,432,731 A * | 7/1995 | Kirsch et al. .................. | 365/145 |
| 5,677,865 A * | 10/1997 | Seyyedy ....................... | 365/145 |
| 5,953,619 A | 9/1999 | Miyazawa et al. | |
| 6,008,659 A | 12/1999 | Traynor | |
| 6,038,160 A * | 3/2000 | Nakane et al. ................. | 365/145 |
| 6,335,876 B1 * | 1/2002 | Shuto ............................ | 365/145 |
| 6,358,758 B2 * | 3/2002 | Arita et al. ...................... | 438/3 |
| 6,388,913 B1 * | 5/2002 | Kuo et al. ...................... | 365/145 |
| 6,735,546 B2 * | 5/2004 | Scheuerlein .................. | 702/132 |
| 6,878,980 B2 * | 4/2005 | Gudesen et al. .............. | 257/295 |
| 6,898,104 B2 * | 5/2005 | Ogiwara et al. .............. | 365/145 |
| 6,928,376 B2 * | 8/2005 | Rodriguez et al. ............ | 702/118 |
| 7,085,150 B2 * | 8/2006 | Rodriguez et al. ............ | 365/145 |
| 7,148,530 B2 * | 12/2006 | Shin et al. ...................... | 257/295 |
| 7,768,811 B2 * | 8/2010 | Matsuno et al. .............. | 365/145 |
| 2007/0211512 A1 * | 9/2007 | Shuto ............................ | 365/145 |

FOREIGN PATENT DOCUMENTS

| | | |
|---|---|---|
| JP | 11-102600 A | 4/1999 |
| JP | 2001-67896 A | 3/2001 |
| JP | 2002-8397 A | 1/2002 |

OTHER PUBLICATIONS

Tetsuro, Machine Translation of JP 11-102600, Feb. 15, 2008, JPO.*
Tetsuro JP 1999-102600 (JP 11-102600) English translation by USPTO, McElroy Translation Company, Mar. 2008, p. 1-32.*
International Search Report of PCT/JP2004/007962 date of mailing Mar. 22, 2005.

* cited by examiner

*Primary Examiner* — Thomas Valone
(74) *Attorney, Agent, or Firm* — Westerman, Hattori, Daniels & Adrian, LLP

(57) ABSTRACT

A method for inspecting a semiconductor memory having nonvolatile memory cells using ferroelectric capacitors is disclosed which comprises, after shelf-aging the ferroelectric capacitor in a first polarized state, the steps of: (a) writing a second polarized state opposite to the first polarized state; (b) shelf-aging the ferroelectric capacitor in the second polarized state; and (c) reading the second polarized state. The temperature or voltage in the step (a) is lower than the temperature or voltage in the step (c). This method for inspecting a semiconductor memory enables to evaluate the imprint characteristics in a short time.

20 Claims, 9 Drawing Sheets

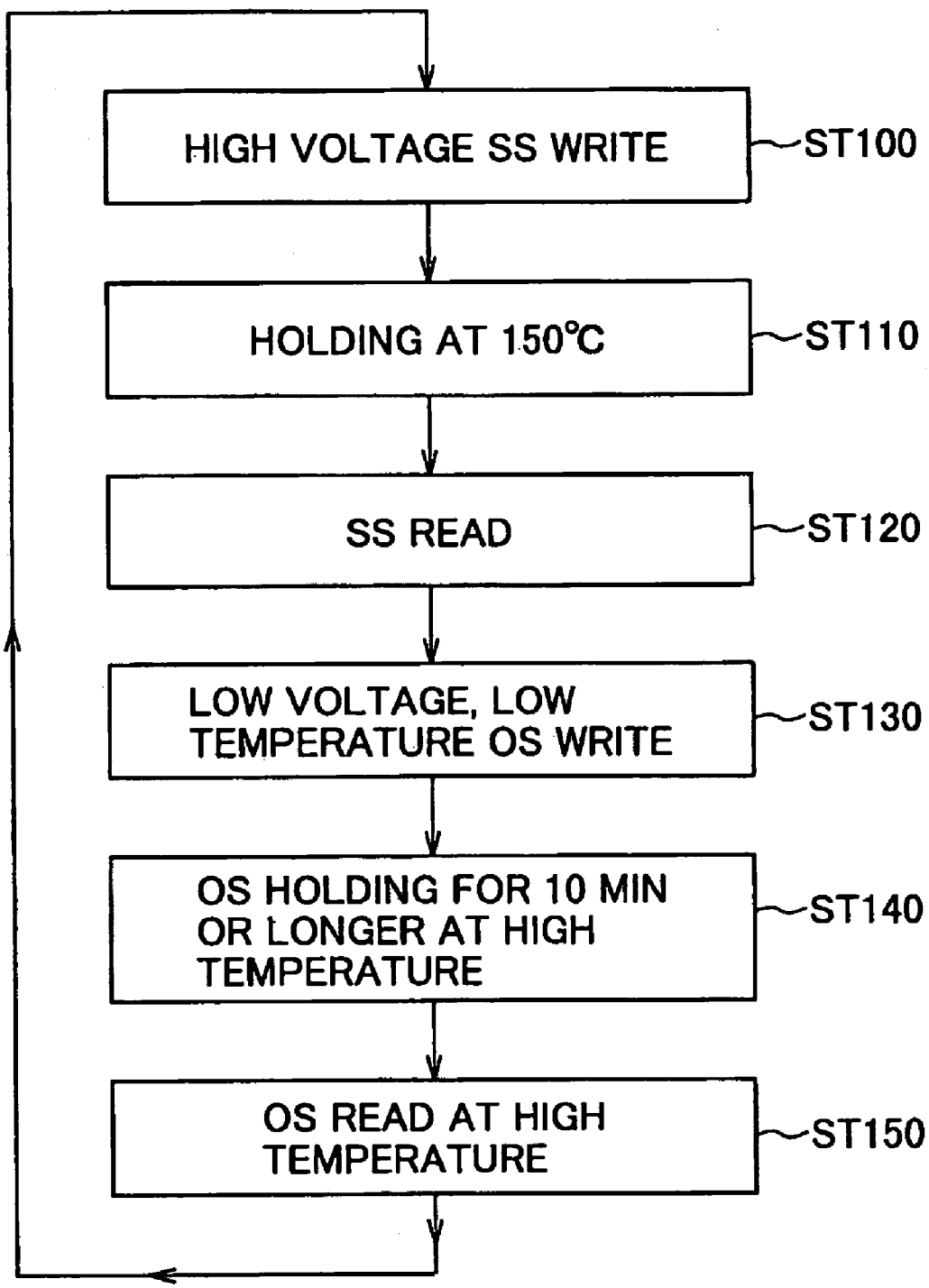

FIG.2A
| ST100 (SS-W) | | ST130 (OS-W) | | ST140 (OS-WT) | | ST150 (OS-R) | |
|---|---|---|---|---|---|---|---|
| VOLTAGE (V) | TEMPERATURE (°C) | VOLTAGE (V) | TEMPERATURE (°C) | TIME (min) | TEMPERATURE (°C) | VOLTAGE (V) | TEMPERATURE (°C) |
| 3.6 | R.T. (~25°C) | 2.7 | −45 | 15 | 85 | 2.7 | −45 |
| 3.6 | R.T. (~25°C) | 2.7 | −45 | 15 | 85 | 2.7 | 85 |
| 3.6 | R.T. (~25°C) | 2.7 | −5 | 15 | 85 | 2.7 | 85 |
| 3.6 | R.T. (~25°C) | 2.7 | 25 | 15 | 85 | 2.7 | 85 |
FIG.2B
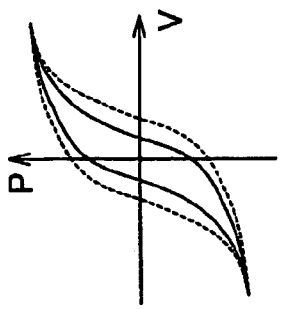
| ST130 (OS WRITE) TEMPERATURE (°C) | ST150 (OS READ) TEMPERATURE (°C) | NUMBER OF DEFECTIVE BITS |
|---|---|---|
| −45 | −45 | 0 |
| −45 | 85 | 1471 |
| −5 | 85 | 0 |
| 25 | 85 | 0 |
FIG.2C
FIG.2D

FIG.3A
| ST100 (SS-W) | | ST130 (OS-W) | | ST140 (OS-WT) | | ST150 (OS-R) | |
|---|---|---|---|---|---|---|---|
| VOLTAGE (V) | TEMPERATURE (°C) | VOLTAGE (V) | TEMPERATURE (°C) | TIME (min) | TEMPERATURE (°C) | VOLTAGE (V) | TEMPERATURE (°C) |
| 3.7 | R.T. (~25°C) | 2.6 | R.T. (~25°C) | 0 | 90 | 2.6 | R.T. (~25°C) |
| 3.7 | R.T. (~25°C) | 2.6 | R.T. (~25°C) | 1 | 90 | 2.6 | R.T. (~25°C) |
| 3.7 | R.T. (~25°C) | 2.6 | R.T. (~25°C) | 10 | 90 | 2.6 | R.T. (~25°C) |
| 3.7 | R.T. (~25°C) | 2.6 | R.T. (~25°C) | 20 | 90 | 2.6 | R.T. (~25°C) |
| 3.7 | R.T. (~25°C) | 2.6 | R.T. (~25°C) | 60 | 90 | 2.6 | R.T. (~25°C) |
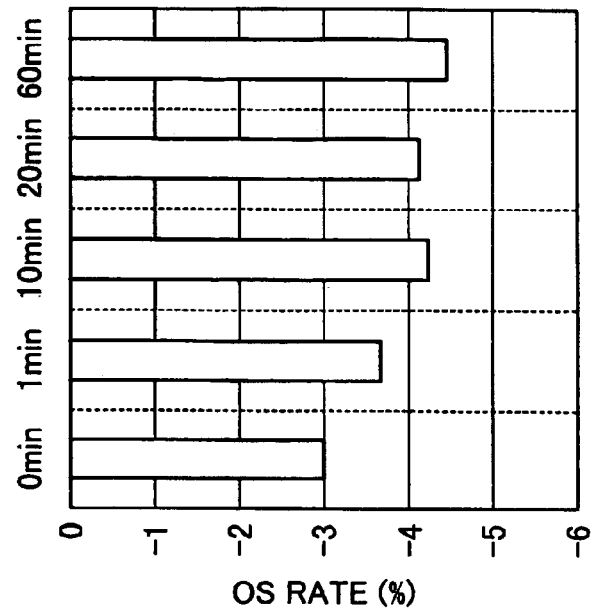
FIG.3C
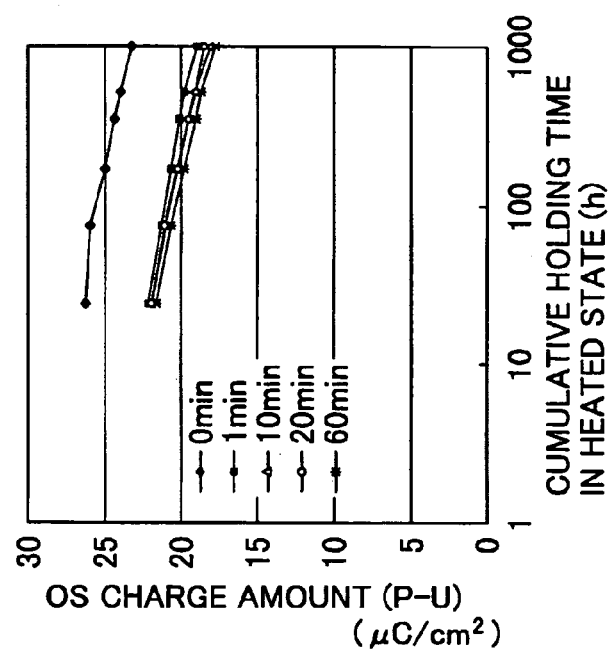
FIG.3B

FIG.4A
| | ST100 (SS-W) | | ST130 (OS-W) | | ST140 (OS-WT) | | ST150 (OS-R) | |
|---|---|---|---|---|---|---|---|---|
| | VOLTAGE (V) | TEMPERATURE (°C) | VOLTAGE (V) | TEMPERATURE (°C) | TIME (min) | TEMPERATURE (°C) | VOLTAGE (V) | TEMPERATURE (°C) |
| | 3.7 | R.T. (~25°C) | 2.2 | R.T. (~25°C) | 20 | 90 | 2.6 | R.T. (~25°C) |
| | 3.7 | R.T. (~25°C) | 2.6 | R.T. (~25°C) | 20 | 90 | 2.6 | R.T. (~25°C) |
| | 3.7 | R.T. (~25°C) | 3 | R.T. (~25°C) | 20 | 90 | 2.6 | R.T. (~25°C) |
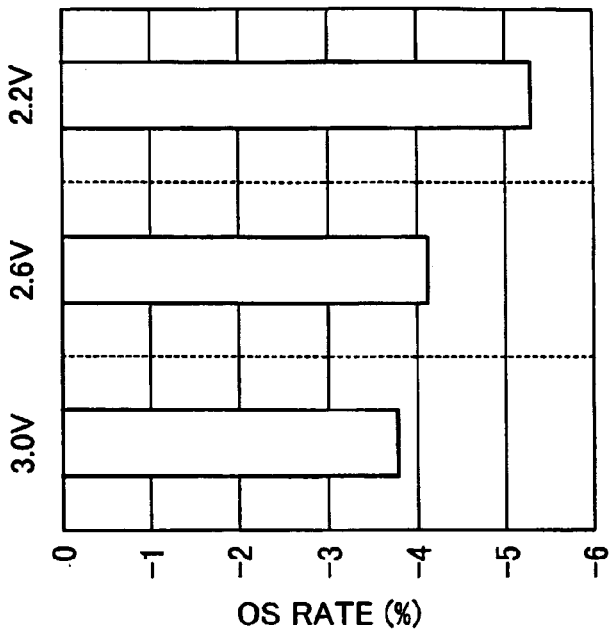
FIG.4C
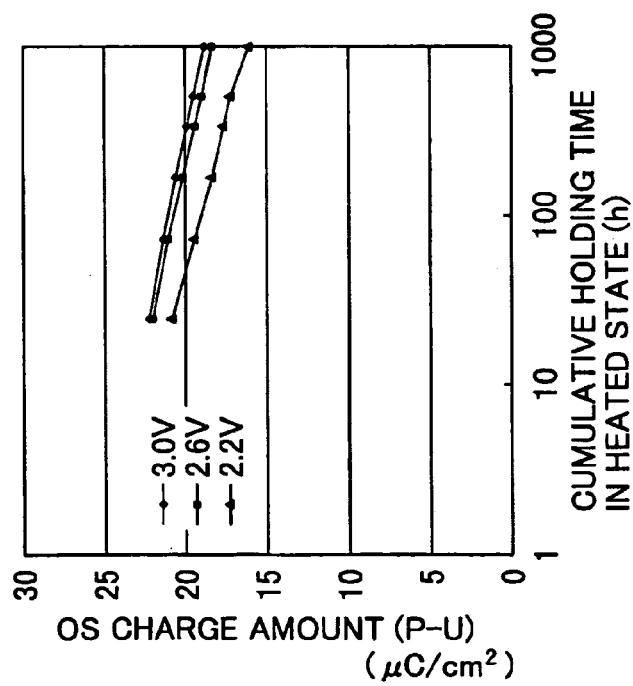
FIG.4B

FIG.5A
| | ST100 (SS-W) | | ST130 (OS-W) | | ST140 (OS-WT) | | ST150 (OS-R) | |
|---|---|---|---|---|---|---|---|---|
| VOLTAGE (V) | TEMPERATURE (°C) | VOLTAGE (V) | TEMPERATURE (°C) | TIME (min) | TEMPERATURE (°C) | VOLTAGE (V) | TEMPERATURE (°C) |
| 4.4 | R.T. (~25°C) | 2.6 | R.T. (~25°C) | 20 | 90 | 2.6 | R.T. (~25°C) |
| 3.7 | R.T. (~25°C) | 2.6 | R.T. (~25°C) | 20 | 90 | 2.6 | R.T. (~25°C) |
| 3 | R.T. (~25°C) | 2.6 | R.T. (~25°C) | 20 | 90 | 2.6 | R.T. (~25°C) |
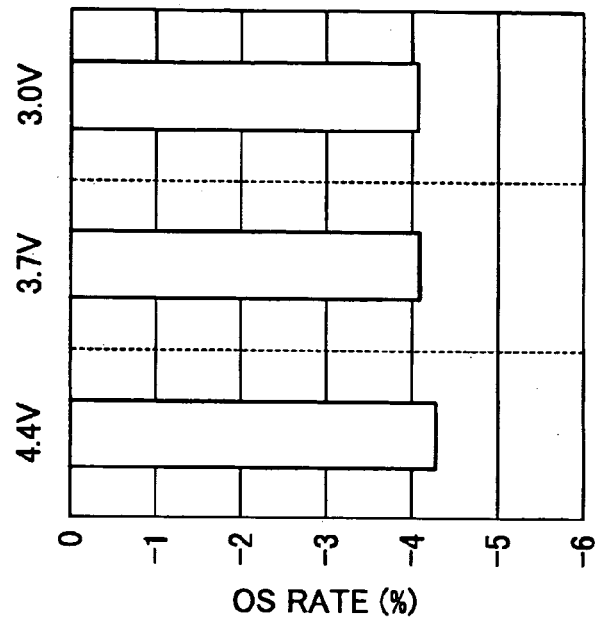
FIG.5C
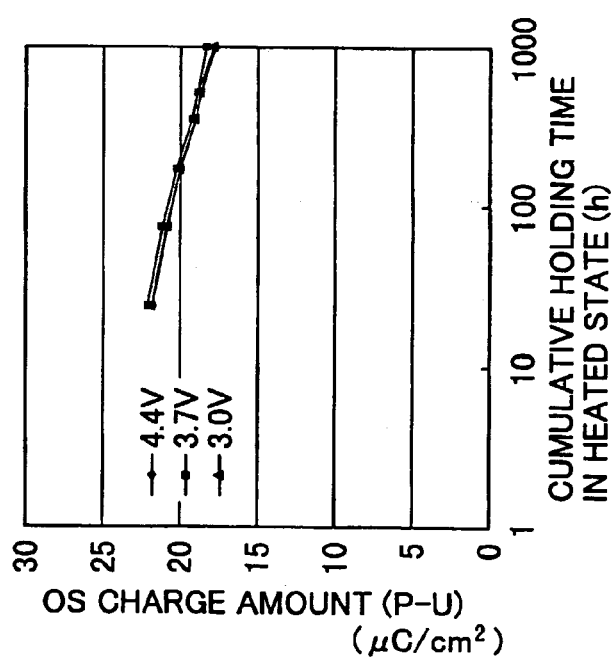
FIG.5B

|  |  | ST100 | ST110 | ST120 | ST130 | ST140 | ST150 |
|---|---|---|---|---|---|---|---|
| DEVICE | VOLTAGE | Min. |  | Min. | Min. |  | Min. |
| | TEMPERATURE | H | 150°C | H | H | H | H |
| | TIME |  | 10h |  |  | 5sec |  |
| MONITOR | VOLTAGE | Mid. |  | Mid. | Mid. |  | Mid. |
| | TEMPERATURE | RT | 150°C | RT | RT | RT | RT |
| | TIME |  | 10h |  |  | 30sec |  |

INSPECTION METHOD FOR SEMICONDUCTOR MEMORY

CROSS REFERENCE TO RELATED APPLICATION

This application is a continuation application of International Patent Application PCT/JP2004/007962 filed on Jun. 8, 2004, and designating USA.

BACKGROUND OF THE INVENTION

A) Field of the Invention

The present invention relates to an inspection method for a semiconductor memory, and more particularly to an inspection method for a semiconductor memory using ferroelectric material.

B) Description of the Related Art

Because of recent spread of portable apparatus, demands for energy savings and reduction in wastes, there are high demands for nonvolatile memories capable of storing data even if a power supply is stopped. Semiconductor memories using ferroelectric capacitors (FeRAM) are nonvolatile memories capable of operating at a low voltage and rewriting data a number of times, and are widely used in integrated circuits incorporating logic circuits, and in other integrated circuits.

FIG. 6A is a schematic cross sectional view showing the structure of a ferroelectric capacitor. A ferroelectric layer 105 is sandwiched between a lower electrode 101 and an upper electrode 102 to constitute a ferroelectric capacitor. For example, the lower electrode is connected to a plate line PL and the upper electrode is connected to a bit line BL via a switching transistor.

As a pulse voltage of a positive polarity is applied to the upper electrode 102 relative to the lower electrode 101, an upward first polarized state S1 is left in the ferroelectric layer 105. As a pulse voltage of an opposite polarity is applied, a downward second polarized state S2 is left in the ferroelectric layer 105.

FIG. 6B is a graph showing the hysteresis characteristics of ferroelectric material. The abscissa represents a voltage applied to the lower electrode 101 with the upper electrode as a reference. The ordinate represents a polarization (charge) P in the ferroelectric layer. As an applied voltage is scanned, state transition with hysteresis characteristics occurs as indicated by arrows. A voltage at the cross point between the hysteresis curve and a voltage axis is a coercive voltage Vc. This will be described in more detail. It is assumed that the ferroelectric layer is in the polarized state S1, and that a pulse Vp of a positive polarity is applied to the lower electrode 101.

As show in FIG. 6C, as the voltage applied to the lower electrode rises, state transition occurs in the ferroelectric layer as indicated by an arrow and the upward polarization reduces. As the voltage rises further, downward polarization increases. A state T1 is established at a peak voltage V1. During this change, positive charges flow into the lower electrode, and positive charges P are drained out from the upper electrode 102 to the bit line BL. As the applied voltage is lowered, the state T1 in the ferroelectric layer changes to a state S2. During this change, negative charges Pa are drained out from the upper electrode 102 to the bit line BL.

FIG. 6D illustrates state transition while a pulse voltage Vp of the positive polarity is applied to the lower electrode of the ferroelectric capacitor in the polarized state S2. As the pulse voltage rises, state transition occurs in the ferroelectric capacitor from S2 to T1 and positive charges U are drained out from the upper electrode 102 to the bit line BL. As the pulse voltage falls, state transition occurs in the ferroelectric capacitor from T1 to S2 and negative charges Ua are drained out from the upper electrode 102 to the bit line BL.

FIG. 6E illustrates state transition when a pulse voltage Vn of the negative polarity is applied to the lower electrode of the ferroelectric capacitor, which has been in the polarized state S2. As the pulse voltage Vn of the negative polarity rises, state transition occurs in the ferroelectric capacitor from S2 to T2 and negative charges N are drained out from the upper electrode 102 to the bit line BL. As the pulse voltage Vn of the negative polarity falls, state transition occurs in the ferroelectric capacitor from T2 to S1 and positive charges Na are drained out from the upper electrode 102 to the bit line BL.

FIG. 6F illustrates state transition when a pulse voltage Vn of the negative polarity is applied to the lower electrode of the ferroelectric capacitor which has been in the polarized state S1. As the pulse voltage of the negative polarity rises, state transition occurs in the ferroelectric capacitor from S1 to T2 and negative charges D are drained out from the upper electrode 102 to the bit line BL. As the pulse voltage of the negative polarity falls, state transition occurs in the ferroelectric capacitor from T2 to S1 and positive charges Da are drained out from the upper electrode 102 to the bit line BL.

A ferroelectric capacitor demonstrates a phenomenon called imprint as shown in FIG. 7A. In FIG. 7A, the abscissa and ordinate represent a lower electrode voltage and polarization similar to FIG. 6B. There is a tendency that the hysteresis characteristics change from H0 to H1 as the polarized state S1 is held. As the reversed polarized state S2 is held, there is a tendency that the hysteresis characteristics change from H0 to H2 opposite to H1.

As shown in FIG. 7B, as the polarized state S1 is held and the hysteresis characteristics are imprinted from H0 to H1, an accumulated polarization amount is reduced by a polarization amount ΔP1 when S1 of the opposite polarity is written thereafter.

As shown in FIG. 7C, as the polarized state S2 is held and the hysteresis characteristics are imprinted from H0 to H2, an accumulated polarization amount is reduced by a polarization amount ΔP2 when S1 of the opposite polarity is written thereafter. If the polarization amount reduces and it becomes impossible to read, the function of a memory device is lost.

FIG. 8A shows an example of the structure of a memory cell of FeRAM of two transistors and two capacitors (2T/2C) type. One FeRAM cell includes two ferroelectric capacitors Cx and Cy and two switching transistors Tx and Ty whose drain electrodes are connected to the upper electrodes of the ferroelectric capacitors. The source electrodes of the two switching transistors Tx and Ty are connected to bit lines BL and /BL, the gate electrodes are connected in common to a word line WL, and the lower electrodes of the ferroelectric capacitors Cx and Cy are connected in common to a plate line PL. A sense amplifier SA is connected between the bit lines BL and /BL.

Information of opposite polarities is stored in the ferroelectric capacitors Cx and Cy. For example, when "1" is to be stored, information "1" is stored in the ferroelectric capacitor Cx and information "0" is stored in the ferroelectric capacitor Cy. When data is read, the sense amplifier SA detects a voltage difference between the bit lines BL and /BL.

A 1T/1C structure is also used, which constitutes one memory cell by one transistor and one capacitor. In this case, for example, a combination of a right transistor and a right ferroelectric capacitor is used as a memory cell, and a reference cell is used in place of a combination of a left transistor and a left ferroelectric capacitor. Although a charge amount capable of being detected is reduced to a half, there is no essential difference. Therefore, in the following the 2T/2C structure will be described by way of example.

FIG. 8B illustrates a procedure of inspecting FeRAM. FIG. 8C is a diagram showing pulse voltage trains applied to two ferroelectric capacitors Cx and Cy of one FeRAM with indication of charge outputs drained to the bit lines during execution of the procedure shown in FIG. 8B. The pulse voltage is applied to the lower electrode by using the voltage at the upper electrode as a reference.

First, at Step ST100 first data is written. Thereafter, first data is read, and second data of an opposite polarity is written and read. The first data is called the same state (SS) and the second data is called an opposite polarity state (OS).

As shown in the left area of FIG. 8C, a pulse voltage Vp of the positive polarity is applied to the capacitors Cx and Cy to make the capacitors have "0" polarized states. Next, a pulse voltage of the positive polarity is applied to the capacitor Cx and a pulse voltage of the negative polarity is applied to the capacitor Cy to write "0" in the capacitor Cx and "1" in the capacitor Cy. The first data (SS) is therefore stored.

At the next Step ST110, the capacitors written with the first data (SS) are held in a heated state, e.g., 150° C. and for a long time, e.g., 10 hours. Deterioration of stored information is accelerated in the heated state. There is a possibility that a hysteresis shift occurs due to imprint. Thereafter, at Step ST120 the first data (SS) is read.

As shown in the left portion of the central area of FIG. 8C, a pulse voltage of the positive polarity is applied to the capacitors. As the pulse voltage rises, positive charges U corresponding to "0" are drained out from the capacitor Cx to the bit line BL and positive charges P corresponding to "1" are drained out from the capacitor Cy to the bit line /BL. The stored first data (SS) is read from a difference between the positive charges. Since the stored information is lost by the read operation, in accordance with the read information, "0" is written again in the capacitor Cx and "1" is written again in the capacitor Cy. If polarization is degraded, the first data may not be read in some cases. It is possible to inspect the retention characteristics by reading the first data (SS).

At Step ST130, the second data (OS) of opposite polarities is written. As shown in the right portion of the central area of FIG. 8C, a pulse voltage Vp of the positive polarity is applied to the capacitors to make the capacitors have "0" polarized states. Next, a pulse voltage Vn of the negative polarity is applied to the capacitor Cx to write "1" and a pulse voltage Vp of the positive polarity is applied to the capacitor Cy to write "0". If there is imprint, stored polarization reduces.

At Step ST140, the written second data is held for a short time, e.g., 5 seconds. This realizes relaxation and stabilized temperature and functions to prevent imprint evaluation from becoming rough.

At the next Step ST150, the second data (OS) is read. As shown in the right area of FIG. 8C, a pulse voltage of the positive polarity is applied to the capacitors. As the pulse voltage rises, positive charges P corresponding to "1" are drained out from the capacitor Cx to the bit line BL and positive charges U corresponding to "0" are drained out from the capacitor Cy to the bit line /BL. The stored second data (OS) is read from a difference between the positive charges. Since the stored information is lost by the read operation, in accordance with the read information, "1" is written again in the capacitor Cx and "0" is written again in the capacitor Cy.

If a polarization amount reduces due to imprint of the first data, the second data may not be read in some cases. It is possible to inspect the imprint characteristics by reading the second data (OS). If life evaluation is to be performed, the flow returns to Step ST100 from Step ST150 and the inspection Steps are repeated.

In actual inspection of FeRAM, device inspection and monitor inspection are performed. The former performs defect inspection for all memory cells, and the latter measures charge amounts read from selected memory cells.

FIG. 9A is a table showing the conditions of both the device inspection and monitor inspection. Voltages, temperatures and times used in the device inspection and monitor inspection are shown at each Step. The voltage of the device inspection is a minimum voltage in an operation voltage range at all Steps. This is because strict judgement is required by setting the conditions severe. The temperatures is 150° C. at the heated-shelf-aging Step ST110, and a high (H) temperature at other Steps. The shelf-aging time is 10 hours at the heated-shelf-aging Step ST110, and 5 seconds at Step ST140. The voltage of the monitor inspection is a central voltage in the operation voltage range. The temperature is 150° C. at the heated-shelf-aging Step ST110, and a room temperature (RT) at other Steps. The shelf-aging time is 10 hours at the heated-shelf-aging Step ST110, and 30 seconds at ST140. The voltage and temperature are constant at data read/write Steps of both the device inspection and monitor inspection.

The structure and manufacture method for FeRAM are disclosed, for example, in U.S. Pat. No. 5,953,619 which is incorporated herein by reference. An inspection method for FeRAM is disclosed, for example, in U.S. Pat. No. 6,008,659 which is incorporated herein by reference.

Inspection of FeRAM imprint poses a particular issue. JPA-2001-67896 proposes inspecting how imprint occurs by measuring a difference between operation lower limit voltages of opposite polarity data before and after high temperature shelf-aging. JP-A-2002-8397 proposes writing first data at a highest operation voltage (in the embodiment, writing first data a plurality of times until predetermined imprint occurs) to form imprint, thereafter writing opposite polarity second data, performing shelf-aging and reading, to realize inspection reflecting the imprint.

SUMMARY OF THE INVENTION

An object of the present invention is to provide an inspection method for a semiconductor memory capable of evaluating imprint characteristics in a short time.

According to one aspect of the present invention, there is provided an inspection method for a semiconductor memory having nonvolatile memory cells using ferroelectric capacitors, the method comprising the steps, to be executed for each ferroelectric capacitor, of:

(a) writing a first polarized state at a first write voltage;
(b) heated-shelf-aging the first polarized state;
(c) reading the first polarized state at a first read voltage;
(d) after the step (c), writing a second polarized state opposite to the first polarized state;
(e) heated-shelf-aging the second polarized state; and
(f) reading the second polarized state at a second read voltage, wherein at least one of a write voltage, a read voltage and a temperature is different depending upon the step, a retention performance is inspected at the steps (a), (b) and (c), and an imprint performance is inspected at the succeeding steps (d), (e) and (f).

According to another aspect of the present invention, there is provided an inspection method for a semiconductor memory having nonvolatile memory cells using ferroelectric capacitors, the method comprising the steps, to be executed for each ferroelectric capacitor after each ferroelectric capacitor is held in a first polarized state, of:

(a) writing a second polarized state opposite to the first polarized state;

(b) heated-shelf-aging the second polarized state; and (c) reading the second polarized state, wherein a temperature or a voltage at the step (a) is different from a temperature or a voltage at the step (c).

The imprint characteristics can be evaluated in a short time by making imprint appear large or accelerated.

BRIEF DESCRIPTION OF THE DRAWINGS

FIG. 1 is a flow chart illustrating an inspection method for a semiconductor memory having ferroelectric capacitors.

FIGS. 2A to 2D are tables and graphs showing experiments made by changing read/write temperatures of OS.

FIGS. 3A to 3C are a table and graphs showing experiments made by changing a shelf-aging time in a high temperature state after OS write.

FIGS. 4A to 4C are a table and graphs showing experiments made by changing an OS write voltage.

FIGS. 5A to 5C are a table and graphs showing experiments made by changing an SS write voltage.

DESCRIPTION OF THE PREFERRED EMBODIMENTS

First, description will be made on the results of shelf life evaluation of FeRAM devices made by the present inventors using a conventional inspection method.

Figure 6A:
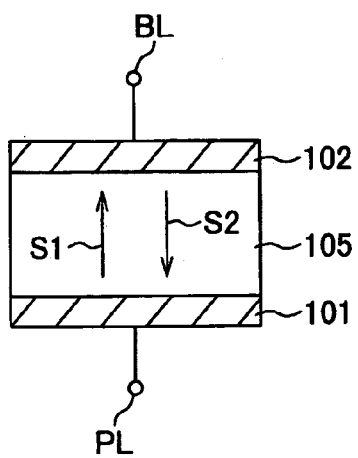
FIGS. 6A to 6F are a cross sectional view and graphs showing a ferroelectric capacitor.
Figure 6B:
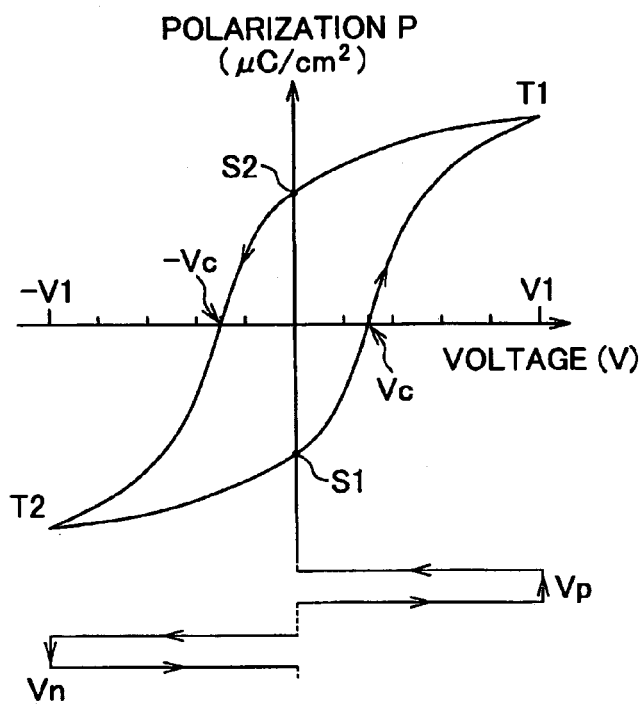
Figure 6C:
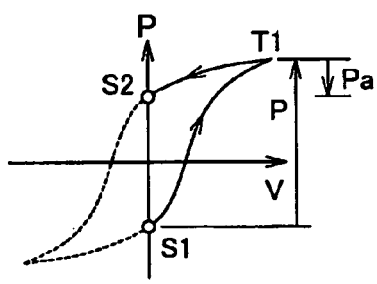
Figure 6D:
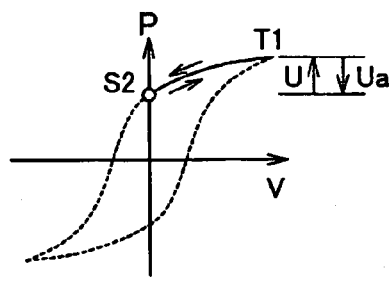
Figure 6E:
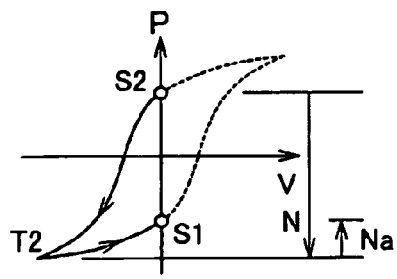
Figure 6F:
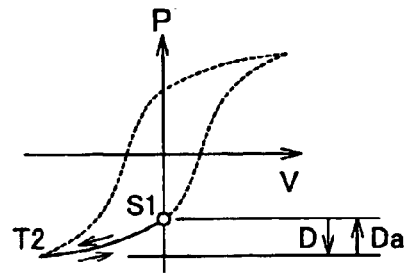
Figure 7A:
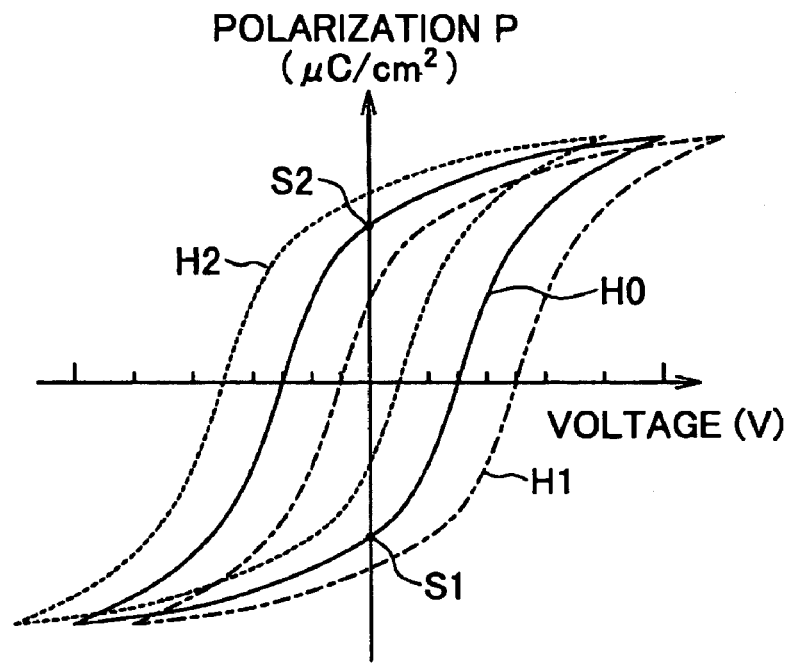
FIGS. 7A to 7C are graphs showing imprint of a ferroelectric capacitor.
Figure 7B:
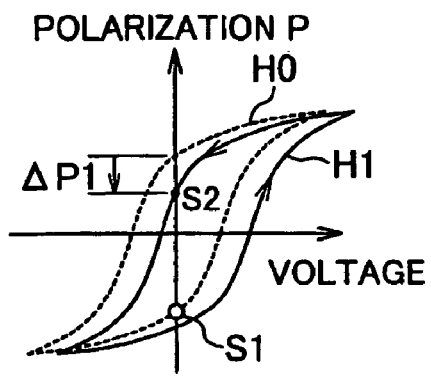
Figure 7C:
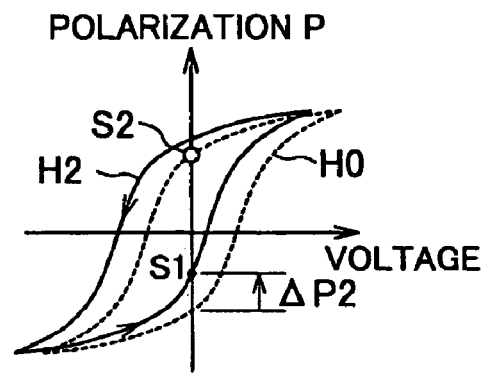
Figure 8A:
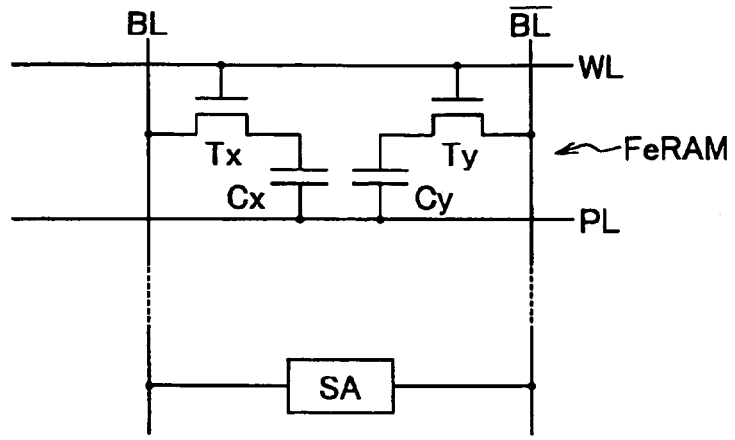
FIGS. 8A to 8C are an equivalent circuit, a flow chart and a timing chart illustrating pulse trains used in inspection for a ferroelectric capacitor.
Figure 8B:
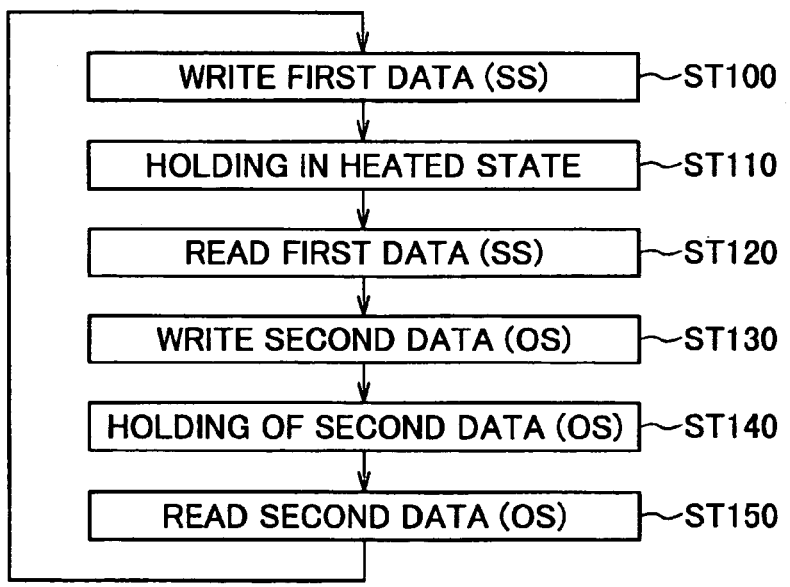
Figure 8C:
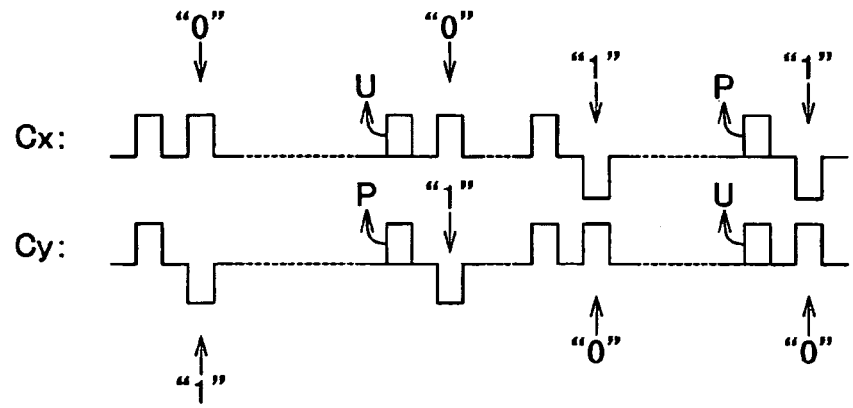
Figures 9A, 9B:
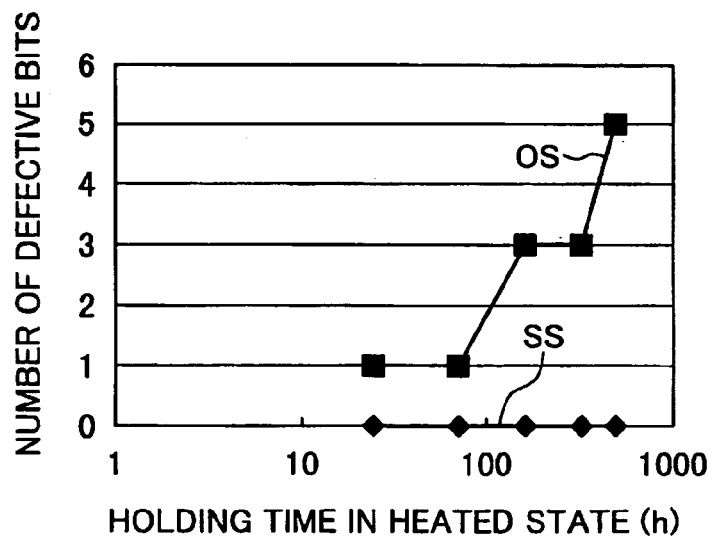
FIGS. 9A and 9B are a table showing an inspection method for a ferroelectric capacitor and a graph showing life measurement results of a device inspection.

FIG. 9B is a graph showing the results of life evaluation of defective bits obtained by repetitively performing the inspection flow shown in FIG. 8B. The ordinate represents the cumulative number of defective bits relative to the retention characteristics (SS) and imprint characteristics (OS). No SS defective bit appeared during life evaluation of 504 hours and the life evaluation was good. One OS defective bit appeared in short time, the number of defective bits started increasing after about 100 hours, and five defective bits appeared at 504 hours. Since the number of defective bits is very small, it takes 500 hours or longer to detect occurrence of imprint. If it is judged that imprint occurs, manufacture processes for the ferroelectric layer are mainly improved. If it takes 500 hours for inspection, feedback is delayed too much so that a development time prolongs and a development cost rises.

FIG. 1 is a flow chart illustrating an inspection method for a semiconductor memory having ferroelectric capacitors according to an embodiment. The flow chart has basically the same Steps to those of the inspection method shown in FIG. 8B, including SS write Step ST100, heated-shelf-aging Step ST110, SS read Step ST120, OS write Step ST130, OS shelf-aging Step ST140 and OS read Step ST150. In the embodiment, the voltage and temperature during data read/write are adjusted as depicted in FIG. 1 to make imprint appear large or accelerated. FIG. 8B will be referred to in the description on experiments unless otherwise specified.

FIGS. 2A to 2D are tables and graphs showing experiments made by changing an OS read/write temperature. FIG. 2A is a table showing experiment conditions used. Description will be made on SS write Step ST100, OS write Step ST130, OS shelf-aging Step ST140 and OS read Step ST150 shown in the uppermost row. SS write Step ST100 was executed at 3.6 V and at a room temperature (about 25° C.), in place of the conventional lowest voltage and high temperature. This is because of an expectation that ferroelectric material may have strong physical peculiarity if data write is performed at high voltage. Heated-shelf-aging Step ST110 and SS read Step ST120 were executed under conventional conditions.

OS write Step ST130 was executed at 2.7 V and at temperatures of −45° C., −5° C. and 25° C., shelf-aging Step ST140 was executed for somewhat longer time of 15 minutes and at a high temperature of 85° C., and OS read Step ST150 was executed at 2.7 V and at temperatures of −45° C. and 85° C. There were four combinations of a write temperature and a read temperature including (−45° C., −45° C.), (−45° C., 85° C.), (−5° C., 85° C.) and (25° C., 85° C.). −45° C. is the lowest operation temperature and 85° C. is the highest operation temperature.

FIG. 2C shows a change in hysteresis expected when the temperature of ferroelectric material is lowered. As the temperature is lowered, the hysteresis changes from a broken line to a solid line and expands in a lateral direction (voltage direction). Since a coercive voltage Vc rises, a write operation may become hard.

FIG. 2D shows a change in hysteresis expected when the temperature of ferroelectric material is raised. As the temperature is raised, the hysteresis changes from a broken line to a solid line and contracts in a vertical direction (polarization direction). Since polarization reduces (degausses), a read operation may become hard.

FIG. 2B shows experiment results. When data was written and read at −45° C., the number of defective bits was 0. It can be considered that read/write can be performed normally even at a lowest operation temperature. As the read temperature was changed to 85° C., the number of defective bits increased to 1,471. This may be ascribed to large appearance imprint. As the write temperature was raised to −5° C., the number of defective bits was 0. The number of defective bits was 0 even if the write temperature was raised to 25° C. (room temperature).

Although the detailed reason is not known, it can be considered that the imprint effect is stressed if OS is written at a low temperature and read at a high temperature. Although defect judgement results of the device inspection have been described, if the monitor inspection is performed and a charge amount is detected, it is expected that the influence of a temperature difference between a write temperature and a read temperature becomes more clearly. It can be understood from the experiment results that imprint effect does not appear large at a temperature difference of 90° and appears very large at a temperature difference of 130° C. A temperature difference may preferably be 100° C. or more.

The reason why Steps ST130 and ST150 of FIG. 1 are executed at low and high temperatures is to expect such imprint emphasis effects.

FIGS. 3A to 3C are a table and graphs showing experiments made by changing a shelf-aging time in a high temperature state set after OS write. FIG. 3A is the table showing the experiment conditions used. SS write Step ST100 was executed at a voltage of 3.7 V and at a room temperature (about 25° C.). OS write Step ST130 was executed at 2.6 V and at a room temperature, and succeeding shelf-aging Step ST140 was executed for 0, 1, 10, 20, and 60 minutes and at 90° C. OS read Step ST150 was executed at 2.6 V and at a room temperature.

FIG. 3B is a graph showing OS shelf-aging time dependency. The abscissa represents a cumulative SS shelf-aging time in a heated state, and the ordinate represents a difference between a charge amount P from the capacitor Cx and a charge amount U from the capacitor Cy, during OS read. Measurement results are plotted for respective samples of the OS shelf-aging times of 0, 1, 10, 20 and 60 minutes. Under any of the conditions, as the shelf-aging time in a heated state prolongs, the OS charge amount reduces. Reduction in the OS charge amount may be ascribed to a progress of imprint.

FIG. 3C is a graph showing a rate (OS rate) in the unit of % representative of loss of the OS charge amount during a shelf-aging time in a heated state of 1000 hours relative to the OS charge amount during a shelf-aging time in a heated state of 24 hours. An OS rate is shown for each OS shelf-aging time. Since Steps ST100 and ST110 are the same for the respective samples, at which Steps imprint may occur, it can be considered that the influence of imprint appears stronger as the absolute value of the OS rate becomes larger. There is a tendency that as the OS shelf-aging time prolongs, the absolute value of the OS rate becomes larger. This increase tendency appears to be saturated at the OS shelf-aging time longer than 10 minutes.

It can be understood that the OS shelf-aging time is set 10 minutes or longer in order to let the imprint appear large. Although the highest OS shelf-aging temperature is set to 85° C., the shelf-aging time is preferably prolonged if the OS shelf-aging temperature is set lower than 85° C. This corresponds to high temperature and 10 minutes or longer at Step ST140 of FIG. 1.

FIGS. 4A to 4C are a table and graphs showing experiments made by changing an OS write voltage. FIG. 4A is the table showing experiment conditions used. SS write Step ST100 and OS read Step ST150 are similar to those shown in FIG. 3A. A write voltage at OS write Step ST130 was changed to 2.2 V, 2.6 V and 3.0 V. A temperature was a room temperature. OS shelf-aging Step ST140 was executed as sufficiently long as 20 minutes and the temperature was further raised to 90° C.

FIG. 4B is a graph showing OS write voltage dependency. The abscissa represents a cumulative SS shelf-aging time in a heated state, and the ordinate represents a difference between a charge amount P from the capacitor Cx and a charge amount U from the capacitor Cy during OS read.
Measurement results are plotted for respective samples of the OS write voltages of 3.0 V, 2.6 V and 2.2 V. Under any of the conditions, as the shelf-aging time in a heated state prolongs, the OS charge amount reduces. Reduction in the OS charge amount may be ascribed to a progress of imprint.

FIG. 4C is a graph showing a rate (OS rate) in the unit of % representative of loss of the OS charge amount during a shelf-aging time in a heated state of 1000 hours relative to the OS charge amount during a shelf-aging time in a heated state of 24 hours. An OS rate is shown for each OS write voltage. Since Steps ST100 and ST110 are the same for the respective samples, at which Steps imprint may occur, it can be considered that the influence of imprint appears stronger as the OS write voltage becomes lower. There is shown a tendency that as the OS write voltage lowers, the absolute value of the OS rate becomes larger. For example, the OS write voltage may preferably be set to the lowest operation voltage. The low voltage at Step ST130 of FIG. 1 corresponds to this lowest operation voltage.

FIGS. 5A to 5C are a table and graphs showing experiments made by changing an SS write voltage. FIG. 5A is the table showing experiment conditions used. A write voltage at SS write Step ST100 was changed to 4.4 V, 3.7 V and 3.0 V. A temperature was a room temperature. OS write Step ST130 was executed at a voltage of 2.6 V and at a room temperature. Namely, the SS write voltage was set higher than the SS read voltage. OS shelf-aging Step ST140 and OS read Step ST150 are similar to those shown in FIG. 4A.

FIG. 5B is a graph showing SS write voltage dependency. The abscissa represents a cumulative SS shelf-aging time in a heated state, and the ordinate represents a difference between a charge amount P from the capacitor Cx and a charge amount U from the capacitor Cy during OS read. Measurement results are plotted for respective samples of the SS write voltages of 4.4 V, 3.7 V and 3.0 V. Under any of the conditions, as the shelf-aging time in a heated state prolongs, the OS charge amount reduces. Reduction in the OS charge amount may be ascribed to a progress of imprint.

FIG. 5C is a graph showing a rate (OS rate) in the unit of % representative of loss of the OS charge amount during a shelf-aging time in a heated state of 1000 hours relative to the OS charge amount during a shelf-aging time in a heated state of 24 hours. An OS rate is shown for each SS write voltage. Since OS write, shelf-aging and read are the same conditions for the respective samples, it can be considered that imprint occurs more strongly as the absolute value of the OS rate becomes larger. There is shown a tendency that as the SS write voltage rises, the absolute value of the OS rate becomes larger. For example, the SS write voltage may preferably be set to the highest operation voltage. The high voltage at Step ST100 of FIG. 1 corresponds to this highest operation voltage.

The present invention has been described in connection with the preferred embodiments. The invention is not limited only to the above embodiments. It will be apparent to those skilled in the art that other various modifications, improvements, combinations, and the like can be made.

What we claim are:

1. An inspection method for a semiconductor memory having nonvolatile memory cells using ferroelectric capacitors, the method comprising the steps, to be executed for each ferroelectric capacitor, of:
    (a) writing a first polarized state at a first write voltage;
    (b) after said step (a), heated-shelf-aging said first polarized state;
    (c) after said step (b), reading said first polarized state at a first read voltage;
    (d) after said step (c), writing a second polarized state opposite to said first polarized state at a first temperature;
    (e) after said step (d), heated-shelf-aging said second polarized state; and
    (f) after said step (e), reading said second polarized state, which has been written at the first temperature, at a second temperature higher than said first temperature, and at a second read voltage, to stress an imprint effect,
    wherein a retention performance is inspected at said steps (a), (b) and (c), and an imprint performance is inspected at said succeeding steps (d), (e) and (f).

2. The inspection method for a semiconductor memory according to claim 1, wherein said second temperature is higher than said first temperature by 100° C. or more.

3. The inspection method for a semiconductor memory according to claim 2, wherein said first temperature is a lowest operation temperature, and said second temperature is a highest operation temperature.

4. The inspection method for a semiconductor memory according to claim 3, wherein said first temperature is −45° C., and said second temperature is 80° C.

5. The inspection method for a semiconductor memory according to claim 3, wherein a temperature at said step (b) is higher than the highest operation temperature.

6. The inspection method for a semiconductor memory according to claim 1, wherein said second write voltage is lower than said first write voltage.

7. The inspection method for a semiconductor memory according to claim 1, wherein said first write voltage is higher than said first read voltage.

8. The inspection method for a semiconductor memory according to claim 1, wherein said step (e) holds said second polarized state for 10 minutes or longer.

9. The inspection method for a semiconductor memory according to claim 8, wherein a temperature at said step (e) is higher than the highest operation temperature.

10. An inspection method for a semiconductor memory having nonvolatile memory cells using ferroelectric capacitors, the method comprising the steps, to be executed for each ferroelectric capacitor after each ferroelectric capacitor is held in a first polarized state, of:
(a) writing a second polarized state opposite to said first polarized state at a first temperature;
(b) after said step (a), heated-shelf-aging said second polarized state; and
(c) after said step (b), reading said second polarized state, which has been written at the first temperature, at a second temperature higher than said first temperature to stress an imprint effect.

11. The inspection method for a semiconductor memory according to claim 10, wherein a voltage at said step (a) is lower than a voltage at said step (c).

12. The inspection method for a semiconductor memory according to claim 11, wherein said second temperature is higher than said first temperature by 100° C. or more.

13. The inspection method for a semiconductor memory according to claim 12, wherein said first temperature is a lowest operation temperature, and said second temperature is a highest operation temperature.

14. The inspection method for a semiconductor memory according to claim 13, wherein said first temperature is −45° C., and said second temperature is 80° C.

15. The inspection method for a semiconductor memory according to claim 13, wherein a temperature at said step (b) is higher than the highest operation temperature.

16. The inspection method for a semiconductor memory according to claim 10, wherein said step (b) heated-shelf-ages said second polarized state for 10 minutes or longer.

17. The inspection method for a semiconductor memory according to claim 16, wherein a temperature at said step (b) is higher then the highest operation temperature.

18. An inspection method for a semiconductor memory having nonvolatile memory cells using ferroelectric capacitors, the method comprising the steps of:
(a) writing data of a first polarity into a ferroelectric capacitor and thereafter reading the data to measure retention characteristics;
(b) after said step (a), writing second data of a polarity opposite to the first polarity at a first temperature; and
(c) after said step (b), reading the second data, which has been written at the first temperature, at a second temperature higher than the first temperature to stress an imprint effect.

19. The inspection method for a semiconductor memory according to claim 18, wherein the second temperature is higher than the first temperature by 100° C. or more.

20. An inspection method for a semiconductor memory having nonvolatile memory cells using ferroelectric capacitors, the method comprising the steps, to be executed for selected memory cells, of:
(a) writing a first polarized state at a first write voltage;
(b) after said step (a), heated-shelf-aging said first polarized state;
(c) after said step (b), reading said first polarized state at a first read voltage;
(d) after said step (c), writing a second polarized state opposite to said first polarized state at a first temperature;
(e) after said step (d), heated-shelf-aging said second polarized state;
(f) after said step (e), reading said second polarized state at a second temperature higher than said first temperature, and at a second read voltage, to stress an imprint effect, and
(g) after said step (c) and after said step (f), measuring electric charge amount read from said selected memory cells,
wherein a retention performance is inspected at said steps (a), (b) and (c), and an imprint performance is inspected at said succeeding steps (d), (e) and (f).

* * * * *